(12) United States Patent  
Tamura

(10) Patent No.: US 7,687,285 B2
(45) Date of Patent: Mar. 30, 2010

(54) METHOD FOR MANUFACTURING FERROELECTRIC MEMORY

(75) Inventor: Hiroaki Tamura, Shimosuwa (JP)

(73) Assignee: Seiko Epson Corporation (JP)

(*) Notice: Subject to any disclaimer, the term of this patent is extended or adjusted under 35 U.S.C. 154(b) by 0 days.

(21) Appl. No.: 12/178,717

(22) Filed: Jul. 24, 2008

(65) Prior Publication Data
US 2009/0075400 A1 Mar. 19, 2009

(30) Foreign Application Priority Data
Sep. 14, 2007 (JP) ............... 2007-239445

(51) Int. Cl.
*H01L 21/00* (2006.01)
(52) U.S. Cl. .......... 438/3; 438/238; 438/240; 438/381; 438/396
(58) Field of Classification Search ........ None
See application file for complete search history.

(56) References Cited

U.S. PATENT DOCUMENTS 6,528,328 B1 * 3/2003 Aggarwal et al. .......... 438/3
6,635,497 B2 * 10/2003 Aggarwal et al. .......... 438/3
2003/0119271 A1 6/2003 Aggarwal et al.

FOREIGN PATENT DOCUMENTS

| JP | 2003-324101 | 11/2003 |
|---|---|---|
| JP | 2004-253627 | 9/2004 |
| JP | 2007-067294 | 3/2007 |

* cited by examiner

*Primary Examiner*—Zandra Smith
*Assistant Examiner*—Khanh B Duong
(74) *Attorney, Agent, or Firm*—Harness, Dickey & Pierce, P.L.C.

(57) ABSTRACT

A method for manufacturing a ferroelectric memory includes the steps of: forming an iridium film above a substrate; forming an iridium oxide layer on the iridium film; changing the iridium oxide layer into an amorphous iridium layer; oxidizing the amorphous iridium layer to form an iridium oxide portion; forming a ferroelectric film on the iridium oxide portion by a MOCVD method; and forming an electrode on the ferroelectric film.

7 Claims, 5 Drawing Sheets

METHOD FOR MANUFACTURING FERROELECTRIC MEMORY

The entire disclosure of Japanese Patent Application No. 2007-239445, filed Sep. 14, 2007 is expressly incorporated by reference herein.

BACKGROUND

1. Technical Field

The present invention relates to methods for manufacturing ferroelectric memories.

2. Related Art

Ferroelectric memories (FeRAM) are nonvolatile memories capable of low voltage and high-speed operation, using spontaneous polarization of ferroelectric material, and their memory cells can be each formed from one transistor and one capacitor (1T/1C). Accordingly, ferroelectric memories can achieve integration at the same level of that of DRAM, and are therefore expected as large-capacity nonvolatile memories. As the ferroelectric material, perovskite type oxides such as lead zirconate titanate (Pb (Zi, Ti) $O_3$: PZT), and bismuth layered compounds such as strontium bismuth tantalate ($SrBi_2TaO_9$: SBT) can be used.

In order to make the aforementioned ferroelectric material exhibit its maximum ferroelectric characteristic, its crystal orientation is extremely important. For example, when PZT is used as the ferroelectric material, a predominant orientation exists depending on its crystal system. Generally, when PZT is used in memory devices, titanium-rich compositions that contain a greater amount of Ti (titanium) compared to Zr (zirconium) is used in order to obtain greater spontaneous polarization. In such a composition range, PZT belongs to a tetragonal system, and its spontaneous polarization axis aligns with the c-axis. In this case, ideally, the maximum polarization can be obtained by orienting it in the c-axis, which is in effect very difficult, and a-axis orientation components perpendicular to the c-axis concurrently exist. It is noted that because the a-axis orientation components do not contribute to polarization inversion, the ferroelectric characteristic may be impaired.

In this respect, it has been conceived to orient the a-axis in a direction offset at a predetermined angle from the substrate normal line by making the crystal orientation of PZT to a (111) orientation. As a result, the polarization axis has a component in the substrate normal line direction, and thus can contribute to polarization inversion. On the other hand, the c-axis orientation component concurrently has its polarization axis oriented to a predetermined offset angle with respect to the substrate normal line direction, such that a certain amount of loss occurs in the amount of surface charge induced by polarization inversion. However, the entire crystal components can be made to contribute to polarization inversion, such that the charge retrieving efficiency significantly excels, compared to the case of the c-axis orientation.

As a method for forming a ferroelectric film with its PZT crystal orientation aligned to a (111) orientation, a method described in Japanese Laid-open Patent Application JP-A-2003-324101 may be used. According to the method described in the aforementioned document, a lower electrode with a (111) crystal orientation is formed from iridium, a surface layer on its upper surface side is thermally oxidized to form an iridium oxide layer, and then a ferroelectric film is formed on the iridium oxide layer. At the time of forming the ferroelectric film, a MOCVD method is used, in which source material gas for the ferroelectric film and oxygen gas are chemically reacted for forming the film. According to this method, the film formation is conducted with a smaller amount of oxygen gas than the amount of oxygen gas necessary for the chemical reaction, and then the film formation is further conducted with an amount of oxygen gas greater than the amount of oxygen gas necessary for the chemical reaction. Although details of the mechanism thereof are not clarified, the iridium oxide layer contributes to determination of growth orientation of PZT, and makes PZT mainly orient to a (111) crystal orientation.

By the method described in the aforementioned document, the crystal orientation of PZT may be improved, but the method entails some points to be improved in order to improve the characteristics of the ferroelectric film. Specifically, iridium that serves as a base for iridium oxide has a very high melting point, and therefore, when a film of iridium whose crystal orientation is in a (111) orientation is formed, the film has a polycrystalline structure having plural crystal grains in a (111) orientation arranged in parallel. Then, when a surface layer thereof is oxidized by thermal oxidation or the like, oxygen gas would more likely penetrate boundary portions of the crystal grains such that these portions would be abnormally oxidized, and protrusions caused by volume expansions due to the abnormal oxidation are created in the iridium oxide layer at positions corresponding to the crystal grain boundaries.

When growing PZT, such protrusions would likely become starting points of the crystal growth, and PZT would often grow in protrusions on them. Protrusions of PZT greater than the protrusions of iridium oxide may at times be generated in the ferroelectric film. PZT formed on the protrusions in the iridium oxide layer do not have a (111) crystal orientation, and therefore its contribution to polarization inversion is reduced, which presents an obstacle to improvements of the characteristics of the ferroelectric film.

SUMMARY

In accordance with an advantage of some aspects of the invention, it is possible to provide a method for manufacturing a ferroelectric memory equipped with a ferroelectric capacitor having an excellent ferroelectric film.

In accordance with an embodiment of the invention, a method for manufacturing a ferroelectric memory includes the steps of: forming an iridium film above a substrate; forming an iridium oxide layer on the iridium film; changing the iridium oxide layer to an amorphous iridium layer; oxidizing the amorphous iridium layer to form an iridium oxide portion; forming a ferroelectric film on the iridium oxide portion by a MOCVD method; and forming an electrode on the ferroelectric film.

By changing the iridium oxide layer to an amorphous iridium layer, the amorphous iridium layer does not have crystal grain boundaries (interfaces) between crystal grains (crystals) that originate from polycrystalline structure of the iridium film, and iridium atoms have uniform density throughout the iridium layer. Therefore, in the oxidation step, uniform oxygen diffusion takes place as the density of iridium atoms is uniform throughout the iridium layer, such that the surface layer portion of the amorphous iridium layer can be uniformly oxidized. Therefore, the iridium oxide portion becomes flat as the volume expansion caused by oxidation is uniform. Therefore, in the step of forming a ferroelectric film, a flat ferroelectric film can be formed on the flat iridium oxide portion. In this manner, the ferroelectric film with excellent characteristics can be formed, and therefore a ferroelectric capacitor with excellent hysteresis characteristics can be manufactured.

The iridium film may preferably have a crystal structure in a (111) crystal orientation. As a result, the crystal orientation of the iridium film can be reflected such that the crystal orientation of the ferroelectric film can be set to a (111) crystal orientation. The ferroelectric film with a (111) crystal orientation can achieve a favorable charge retrieving efficiency, and therefore has excellent ferroelectric characteristics.

The iridium oxide layer may preferably be formed to a thickness between 20 nm and 60 nm. By forming the iridium oxide layer to a thickness of 20 nm or greater, the amorphous iridium layer can have a sufficient thickness. Therefore, when the surface layer portion of the amorphous iridium layer is oxidized in the oxidation step, the iridium film having a polycrystalline structure can be prevented from being oxidized, re-generation of protrusions that may be caused by abnormal oxidation of the iridium film having polycrystalline structure can be prevented. Furthermore, by forming the iridium oxide layer to a thickness of 60 nm or less, the iridium oxide portion has a thickness that can succeed the crystal orientation of the iridium film having a polycrystal structure. Accordingly, in the step of forming a ferroelectric film, the crystal orientation of the iridium film having a polycrystal structure can be reflected through the iridium oxide portion in the crystal growth orientation of an initial layer of the ferroelectric film, such that the ferroelectric film can be formed in a favorable crystal orientation.

Also, in the step of changing the iridium oxide layer into an amorphous iridium layer, the iridium oxide layer may preferably be changed to an amorphous iridium layer by a thermal treatment, and the thermal treatment may preferably be conducted in an oxygen-free atmosphere. As a result, the iridium oxide layer can be thermally dissolved and readily be changed to an amorphous iridium layer.

Moreover, in the step of changing the iridium oxide layer into an amorphous iridium layer and the step of oxidizing the amorphous iridium layer may preferably be conducted in a film forming chamber where the ferroelectric film is formed. As a result, the work efficiency can be improved, and the ferroelectric capacitor can be more effectively manufactured.

Moreover, after the step of forming an iridium oxide layer, the iridium oxide layer may preferably have protrusions on a surface thereof, and after the step of forming an amorphous iridium layer, the amorphous iridium layer may preferably have a flat surface. In general, an iridium oxide layer that is an oxidized iridium layer has protrusions on its surface which are generated by abnormal oxidation. However, when the surface of the amorphous iridium layer is flat, the iridium oxide portion can be made flat, on which a flat ferroelectric film can be formed.

DESCRIPTION OF EXEMPLARY EMBODIMENTS

A preferred embodiment of the invention is described below, but the technical scope of the invention is not limited to the embodiment described below. In the description, various structures are exemplified using drawings. However, it is noted that the measurement and scale of each of the structural members may be made different from those of the actual structure in each of the figures such that characteristic portions of each of the members can be readily recognized.

Ferroelectric Memory

First, an example of a ferroelectric memory that is manufactured by a manufacturing method in accordance with an embodiment of the invention is described.

Figure 1:
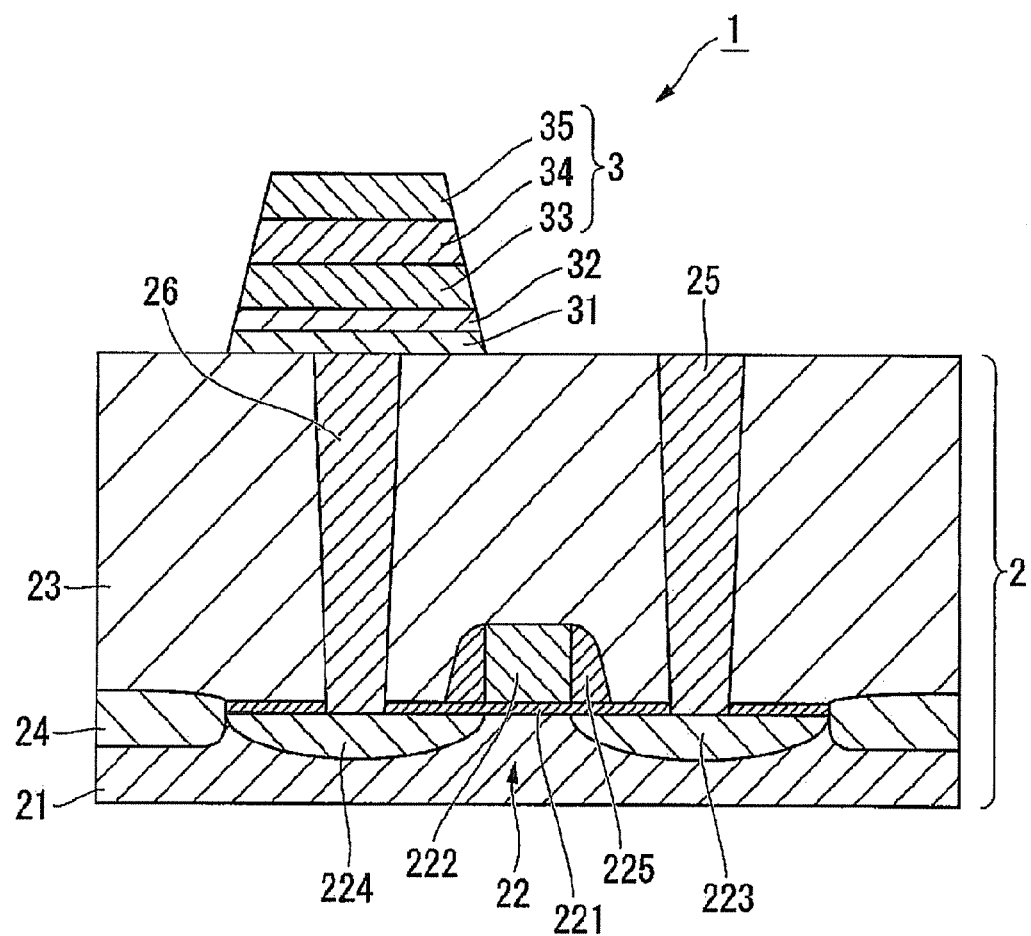
FIG. 1 is a side cross-sectional view of a ferroelectric memory manufactured by a manufacturing method in accordance with an embodiment of the invention.

FIG. 1 is a cross-sectional view of a main portion of the ferroelectric memory. As shown in FIG. 1, the ferroelectric memory 1 has a stacked type structure, and is equipped with a base substrate 2 having a transistor 22, and a ferroelectric capacitor 3 formed on the base substrate 2.

The base substrate 2 is equipped with a silicon substrate (substrate) 21 comprised of, for example, single crystal silicon, the transistor 22 provided thereon, and a base dielectric film 23 comprised of $SiO_2$ that covers the transistor 22. Element isolation regions 24 are provided in the surface layer of the silicon substrate 21, wherein an area between the element isolation regions 24 corresponds to each of the memory cells.

The transistor 22 is formed from a gate dielectric film 221 provided on the silicon substrate 21, a gate electrode 222 provided on the gate dielectric film 221, a source region 223 and a drain region 224 provided on both sides of the gate electrode 222 in a surface layer of the silicon substrate 21, and a side wall 225 provided on a side surface of the gate electrode 222. In the present example, a first plug 25 that conductively connects to the source region 223 is provided on the source region 223, and a second plug 26 that conductively connects to the drain region 224 is provided on the drain region 224.

The first plug 25 and the second plug 26 are formed from a conductive material, such as, for example, W (tungsten), Mo (molybdenum), Ta (tantalum), Ti, Ni (nickel) or the like. The first plug 25 is electrically connected to a bit line (not shown), and the source region 223 and the bit line are conductively connected through the first plug 25.

The ferroelectric capacitor 3 is formed on a conductive film 31 and an oxygen barrier film 32 that are successively formed on the base dielectric film 23 and the second plug 26 in accordance with the present example, and has a structure in which a lower electrode (first electrode) 33, a ferroelectric film 34 and an upper electrode (second electrode) 35 are laminated in this order from the lower layer. The lower electrode 33 is electrically connected to the second plug 26 through the oxygen barrier film 32 and the conductive film 31. In other words, the lower electrode 33 is conductively connected with the drain region 224.

The conductive film 31 is comprised of a conductive material, such as, for example, TiN. The oxygen barrier film 32 is comprised of a material having conductivity and oxygen barrier property, and may be composed of, for example, TiAlN, TiAl, TiSiN, TiN, TaN, TaSiN or the like. Also, the conductive film 31 and the oxygen barrier film 32 may preferably be comprised of a material containing Ti that particularly excels in self-orienting property, whereby the lower electrode 33 and the ferroelectric film 34 can be formed with a favorable crystal orientation.

The lower electrode 33 is formed from a single layer film or a multilayer film of a laminate of plural layers, and includes an iridium film as a topmost layer composed of iridium as a main material. The iridium film is made to have a (111) crystal orientation, and may contain iridium oxide. When a multilayer film is used, a film composed of at least one of iridium, Pt (platinum), Ru (ruthenium), Rh (rhodium), Pd (palladium) and Os (osmium), an alloy thereof, or an oxide thereof may be used for layers other than the topmost layer. In the present example, the lower electrode 33 composed of a single layer of an iridium film is used.

The ferroelectric film 34 is comprised of a ferroelectric material having a perovskite crystal structure that is expressed by a general formula of $ABO_3$. The element A in the general formula includes Pb or Pb having a part thereof replaced with La, Ca (calcium) or Sr (strontium). The element B is composed of Zr or Ti. Moreover, at least one of V (vanadium), Nb (niobium), Ta, Cr (chrome), Mo (molybdenum), W (tungsten) and Mg (magnesium) may be added. As a ferroelectric material composing the ferroelectric film 34, a known material, such as, for example, PZT, SBT, and $(Bi, La)_4Ti_3O_{12}$ (bismuth lanthanum titanate: BLT) can be used. Above all, PZT may preferably be used.

When PZT is used as the ferroelectric material, the content of Ti in the PZT may preferably be made greater than the content of Zr in order to obtain a greater amount of spontaneous polarization. Moreover, when the content of Ti in the PZT is greater than the content of Zr therein, the crystal orientation of the PZT is preferably be in a (111) orientation, because the hysteresis characteristic of the PZT is excellent in this orientation.

The upper electrode 35 is electrically connected to a ground line (not shown) in the present example, and may be formed in a single layer film or a multilayer film of a plurality of laminated layers. As the material for the upper electrode 35, any of the aforementioned materials used for the lower electrode 33 described above, or Al (aluminum), Ag (silver), or Ni (nickel) may be used. Also, in the present example, the upper electrode 35 is composed of a two-layer film of iridium oxide and iridium, whereby the upper electrode 35 can enhance the adhesion with the ferroelectric film 34, and function as an oxygen barrier film with respect to a portion on the side of the ground line.

With the structure described above, when a voltage is applied to the gate electrode 222 of the transistor 22, an electric field is applied across the source region 223 and the drain region 224, thereby turning on the channel, and a current can be circulated through the channel. When the channel is turned on, an electrical signal provided through the bit line electrically connected to the source region 223 is transmitted to the drain region 224, and further transmitted to the lower electrode 33 of the ferroelectric capacitor 3 that is electrically connected to the drain electrode 224. As a result, a voltage can be applied across the upper electrode 35 and the lower electrode 33 of the ferroelectric capacitor 3, whereby a charge (data) can be accumulated in the ferroelectric film 34. In this manner, by switching electrical signals to the ferroelectric capacitor 3 with the transistor 22, data (charge) can be read out or written in the ferroelectric memory 1.

Method for Manufacturing Ferroelectric Memory

Next, a method for manufacturing a ferroelectric memory in accordance with an embodiment of the invention is described. In the present embodiment, a method for manufacturing the ferroelectric memory 1 is described as an example.

FIGS. 2A-2D, FIGS. 3A-3D, and FIGS. 4A-4C are cross-sectional views showing steps of the manufacturing method for manufacturing the ferroelectric memory 1 in accordance with an embodiment of the invention. It is noted that, in the figures used for the following description, the main portion is schematically illustrated in enlargement.

Figure 2A:
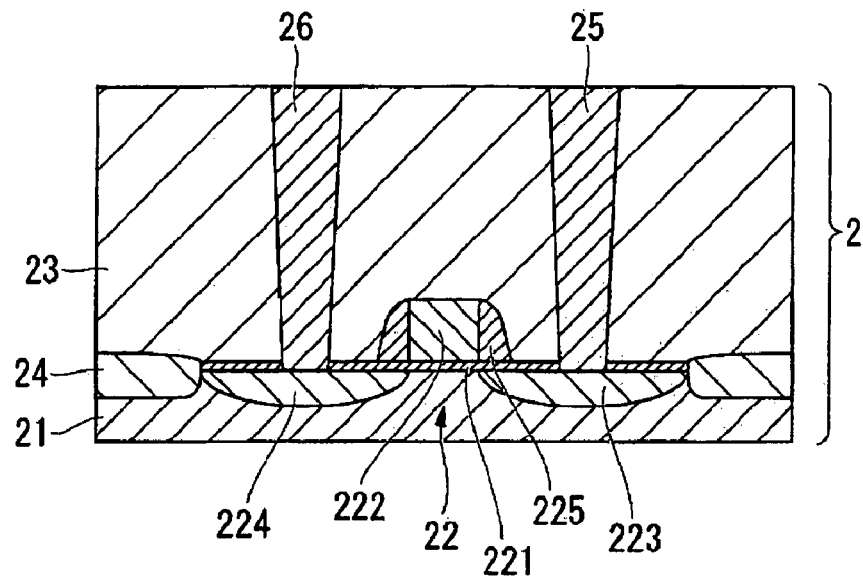
FIGS. 2A-2D are cross-sectional views showing steps of a manufacturing method in accordance with an embodiment of the invention.

First, as shown in FIG. 2A, a base substrate 2 may be formed, using a known method. More specifically, for example, element isolation regions 24 are formed in a silicon substrate (substrate) 21 by a LOCOS method, a STI method or the like, and a gate dielectric film 221 is formed by a thermal oxidation method on the silicon substrate 21 between the element isolation regions 24. Then, a gate electrode 222 comprised of polycrystal silicon or the like is formed on the gate dielectric film 221. Doped regions 223 and 224 are formed by implanting impurities in a surface layer of the silicon substrate 21 between the element isolation regions 24 and the gate electrode 222. Then a sidewall 225 is formed by using an etching back method or the like. In accordance with the present embodiment, the doped region 223 is functioned as a source region, and the doped region 224 is functioned as a drain region.

Then, a film of $SiO_2$ is formed by, for example, a CVD method, thereby forming a base dielectric film 23 on the silicon substrate 21 where the transistor 22 is formed. Then, the base dielectric film 23 on the source region 223 and on the drain region 224, thereby forming a through hole that exposes the source region 223 and a through hole that exposes the drain region 224. Films of, for example, Ti and TiN are formed in the through holes by a sputter method, thereby forming adhesion layers (not shown).

Then, a film of tungsten is formed by, for example, a CVD method over the entire surface of the base dielectric film 23 including inside the through holes, thereby embedding tungsten in the through holes, and the surface of the base dielectric film 23 is polished by a CMP method or the like, whereby tungsten on the base dielectric film 23 is removed. In this manner, a first plug 25 is embedded in the through hole over the source region 223, and a second plug 26 is embedded in the through hole over the drain region 224. The base substrate 2 is formed through the steps described above.

Figure 2B:
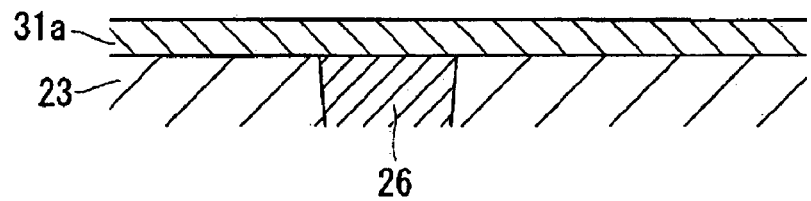

Next, a ferroelectric capacitor 3 is formed (manufactured) on the base dielectric film 23. First, as shown in FIG. 2B, a conductive film 31a is formed on the base dielectric film 23. More specifically, a film of Ti is formed on the base dielectric film 23 by using, for example, a CVD method or a sputter method. It is noted that Ti has a high self-orientation property, and therefore forms a layer in a hexagonal close-packed structure having a (001) crystal orientation. Then, a nitrization treatment in which a heat treatment is applied to the film in, for example, a nitrogen atmosphere (for example, at 500° C. or higher but 650° C. or lower) is conducted, thereby forming a conductive film 31a composed of TiN. By setting the heat treatment temperature at 650° C. or lower, its influence to the characteristics of the transistor 22 can be controlled, and by setting the heat treatment temperature at 500° C. or higher, the nitrization treatment can be shortened. It is noted that, as the crystal orientation of Ti in an original metal state is reflected, the conductive film 31a thus formed has a (111) crystal orientation.

Figure 2C:
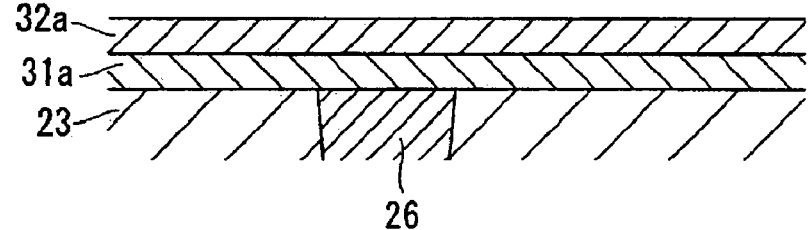

Next, as shown in FIG. 2C, a film of TiAlN is formed on the conductive film 31a by, for example, a sputter method or a CVD method, thereby forming an oxygen barrier film 32a. By forming the oxygen barrier film 32a to have a crystal orientation that matches with that of the conductive film 31a that serves as its base, the oxygen barrier film 32a can be formed epitaxial-like. In other words, the oxygen barrier film 32a in a (111) crystal orientation that reflects the crystal orientation of the conductive film 31a can be formed.

Figure 2D:
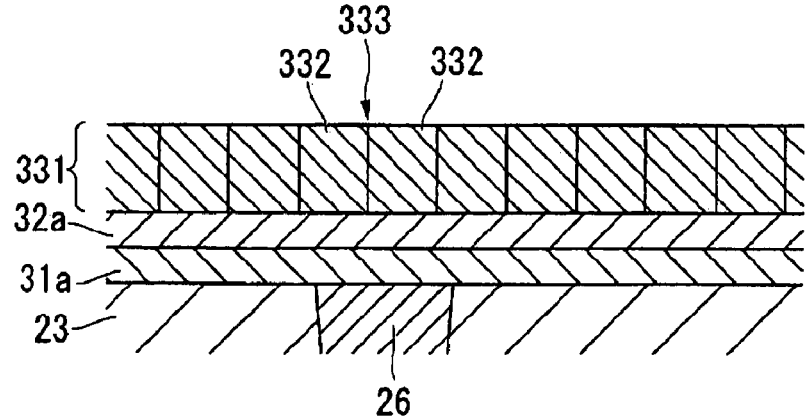

Next, as shown in FIG. 2D, a film of iridium is formed on the oxygen barrier film 32a by a sputter method or the like, thereby forming an iridium film 331. The iridium film 331 can be formed while reflecting the crystal orientation of the base layer, like the oxygen barrier film 32a. As the oxygen barrier film 32a has a (111) crystal orientation, the iridium film 331 can be formed in a (111) crystal orientation. It is noted that the iridium film 331 has many crystal grains 332 that grow in columnar structures in a (111) crystal orientation, and has a polycrystal structure having crystal grain boundaries (interfaces) 333 between the crystal grains (crystals) 332.

Figure 3A:
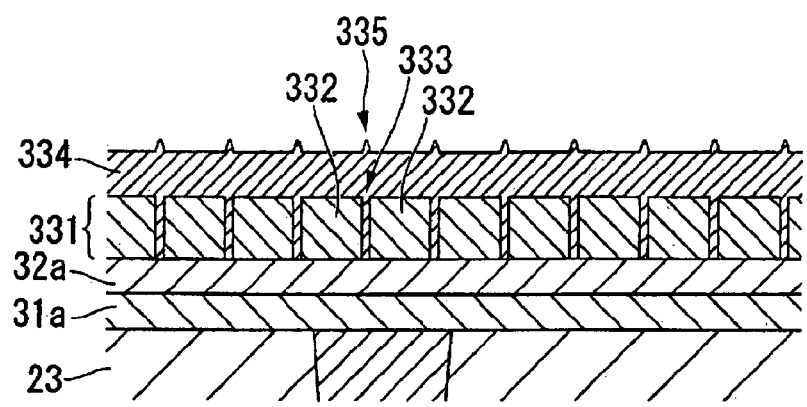
FIGS. 3A-3D are cross-sectional views showing steps of the manufacturing method in accordance with the embodiment of the invention.

Next, as shown in FIG. 3A, an iridium oxide layer 334 is formed at a surface layer of the iridium film 331. As a forming method for forming the iridium oxide layer 334, for example, a method of thermally oxidizing a surface layer of the iridium film 331, a method of forming a film of iridium in an oxygen atmosphere by a sputter method (a reactive sputter method), and forming a film of iridium oxide caused by reaction with the atmosphere gas on the iridium film 331, or the like may be used. By using a thermal oxidation method, the process is simplified, and the cost can be lowered. By using a sputter method, the process temperature can be lowered than the thermal oxidation method, such that thermal influence on the transistor 22 (see FIG. 1) can be reduced. Also, by using a sputter method, the film thickness can be controlled with high precision. In the present embodiment, a MOCVD apparatus 50 shown in FIG. 5 may be used, wherein the iridium oxide layer 334 is formed by a thermal oxidation method. The MOCVD apparatus 50 may also be used in a deoxidation step, an oxidation step, and a ferroelectric film forming step to be conducted later. The structure of the MOCVD apparatus 50 is described below.

Figure 5:
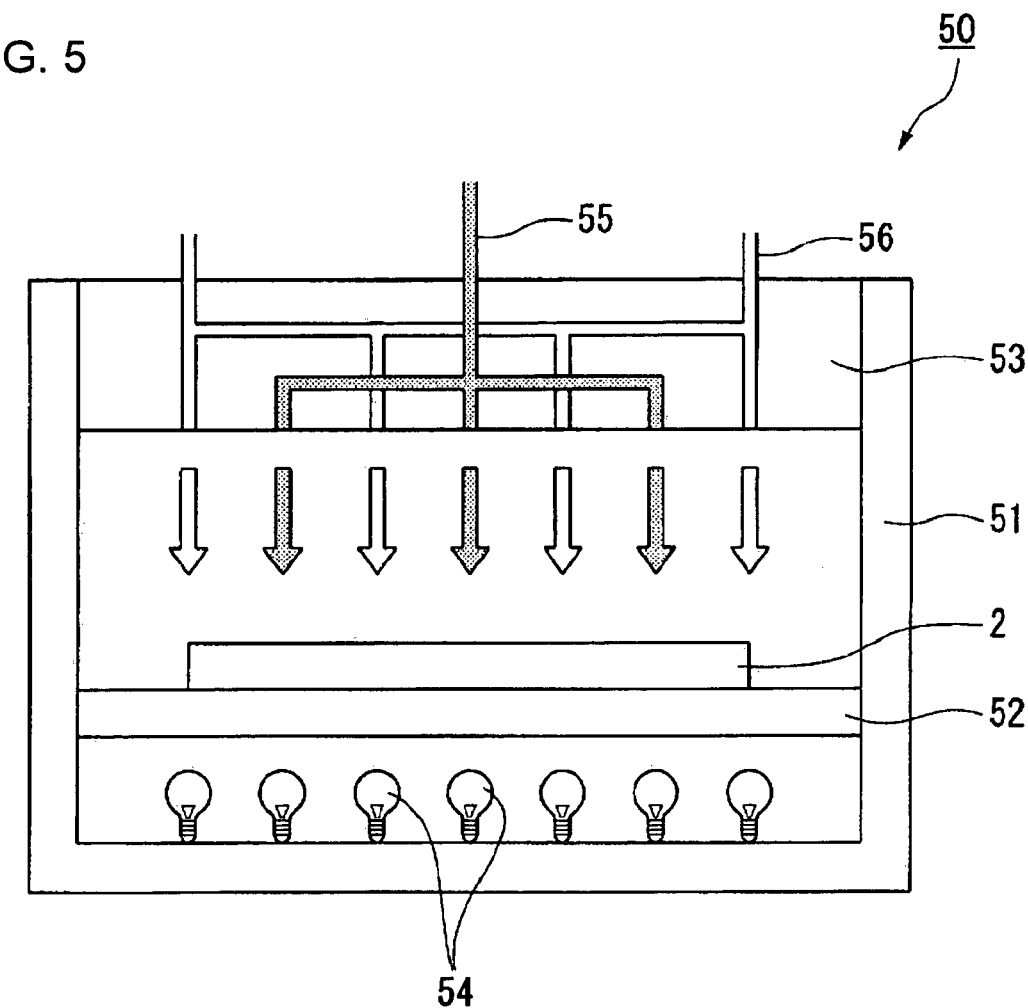
FIG. 5 is a schematic diagram of the structure of a MOCVD apparatus.

FIG. 5 is a schematic diagram of the MOCVD apparatus 50. As shown in FIG. 5, the MOCVD apparatus 50 is equipped with a chamber (a film forming chamber) 51 that houses a base substrate 2, a susceptor 52 disposed inside the chamber 51 for mounting the base substrate 2, a shower head 53 that supplies gas inside the chamber 51, and heater lamps 54 that heat the base substrate 2 placed therein.

The shower head 53 is provided with supply tubes 55 and 56 for supplying source material gas for the ferroelectric film 34, oxygen gas and the like inside the chamber 51. Also, the MOCVD apparatus 50 has a structure in which, by a supply device (not shown) provided outside the chamber 51, the source material gas is supplied through the supply tube 55 into the chamber 51, and the oxygen gas is supplied through the supply tube 56 into the chamber 51. The supply tubes 55 and 56 are provided independently from each other, such that the source material gas and the oxygen gas do not mix until they are supplied into the chamber 51. Also, the chamber 51 is provided with an appropriate exhaust port (not shown). Furthermore, the susceptor 52 is provided with a heater (not shown) independently from the heater lamps 54.

For forming the iridium oxide layer 334 by using the MOCVD apparatus 50 having the structure described above, first, a base substrate 2 (see FIG. 2D) with an iridium film 331 formed thereon is placed on the susceptor 52. Then, oxygen gas is supplied through the supply tube 56 into the chamber 51, and the base substrate 2 is heated by the heater lamps 54 or the heater described above. As a result, oxygen is spread over the iridium film 331, and the iridium film can be thermally oxidized from its surface layer side. In this step, the supply amount of oxygen gas, the heating temperature, the heating time and the like are controlled, whereby the thickness of the iridium oxide layer 334 can be controlled. It is noted that, in accordance with the present embodiment, the thermal oxidation is conducted in a manner that the thickness of the iridium oxide layer 334 including protrusions 335 to be described below becomes to be between 20 nm and 60 nm.

As described above, the iridium film 331 has a polycrystal structure composed of many crystal grains 332, and therefore, oxygen gas would more readily penetrate (diffuse) in crystal grain boundaries 333 between the crystal grains 332. Therefore, areas of the crystal grain boundaries 333 among the crystal grains 332 would more likely be thermally oxidized than upper surface sides of the crystal grains 332. For this reason, as shown in FIG. 3A, protrusions 335 are created in the iridium oxide layer 334 above the crystal grain boundaries 333, because their volume expansion by oxidation is greater than the areas above the crystal grains 332. It is noted that, even when the iridium oxide layer is formed by a sputter method, protrusions 335 would be similarly created because the surface layer of the iridium film 331 is oxidized by oxygen atmosphere.

Figure 3B:
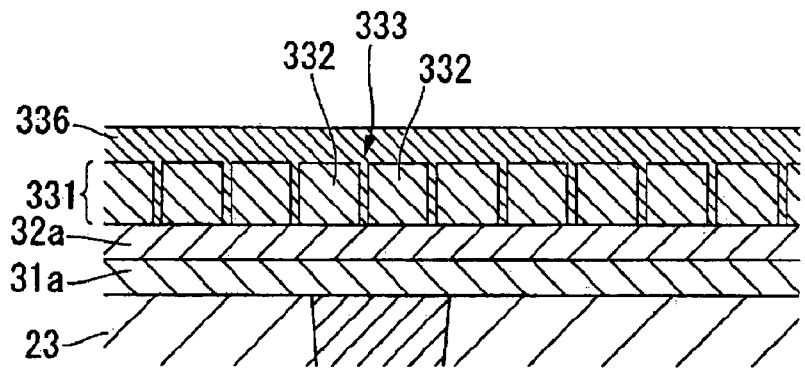

Next, as shown in FIG. 3B, the iridium oxide layer 334 is deoxidized, thereby forming an amorphous iridium layer 336. As a method for deoxidizing the iridium oxide layer 334, for example, a method of heat-treating the iridium oxide layer 334 in an oxygen-free atmosphere, such as, in vacuum, to pyrolyze iridium oxide, and exhausting oxygen gas generated by the pyrolysis, or a method in which a reducing gas is supplied in the chamber 51 through, for example, the supply tube 55 of the MOCVD apparatus 50, and the iridium oxide layer 334 is heat-treated in the reducing atmosphere to reduce iridium oxide may be used. By the method using pyrolysis, the cost for the process can be lowered. By the method using reduction in a reducing atmosphere, deoxidation can be done at lower temperatures than the method using pyrolysis.

In accordance with the present embodiment, the iridium oxide layer 334 is deoxidized by using the pyrolysis method. More specifically, after forming the iridium oxide layer 334 by thermal oxidation, the base substrate 2 is kept disposed on the susceptor 52 of the MOCVD apparatus 50, and oxygen gas supplied in the chamber 51 at the time of thermal oxidation is exhausted. Then, the iridium oxide layer 334 is heated by the heater lamps 54 or the heater described above to about 450° C.-550° C., and oxygen gas generated by the pyrolysis is appropriately exhausted.

In this manner, when iridium oxide is pyrolyzed at temperatures lower than the crystallization temperature of iridium, for example, at temperatures lower than the film forming temperature of an initial film 341 to be described below, only oxygen atoms are removed from the iridium oxide layer 334, which then becomes to be an amorphous iridium layer 336. The amorphous iridium layer 336 becomes more planarized at its top surface than the iridium oxide layer 334 (see FIG. 3A) because the structures of the protrusions 335 collapse during the amorphousizing process. Also, throughout the amorphous iridium layer 336, the density of iridium atoms becomes uniform as the crystal grains have disappeared, such that the density of iridium atoms between the crystal grains 332 and over the crystal grains 332 becomes uniform.

Figure 3C:
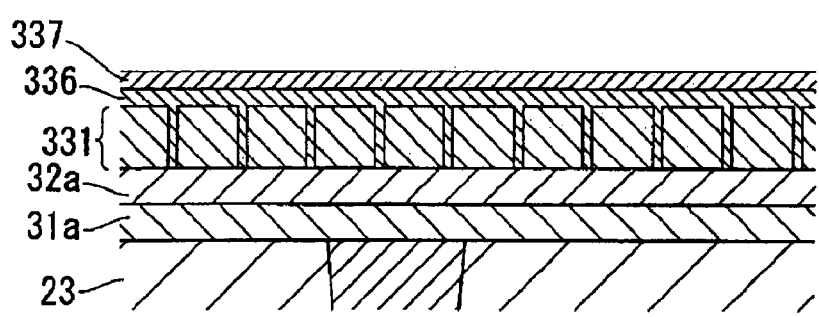

Next, as shown in FIG. 3C, the surface layer portion of the amorphous iridium layer 336 is oxidized again to form an iridium oxide portion 337. More specifically, after forming the amorphous iridium layer 336 by pyrolysis, the base substrate 2 is kept disposed on the susceptor 52 of the MOCVD apparatus 50. Then, while oxygen gas is supplied through the supply pipe 56 in the chamber 51, the amorphous iridium layer 336 is heated by the heater lamps 54 or the heater described above. The amorphous iridium layer 336 has a lower density than that of crystalline iridium, and oxygen would readily be diffused therein, such that the amorphous iridium layer 336 can be uniformly oxidized. Therefore, the volume expansion of the iridium oxide portion 337 by oxidation becomes uniform, such that its upper surface becomes more planarized than the iridium oxide layer 334 (see FIG. 3A). Also, the thickness of the iridium oxide layer 334 is 20 nm or greater as described above, the amorphous iridium layer 336 has a sufficient thickness, which can prevent oxygen from penetrating and oxidizing the iridium film 331.

Figure 3D:
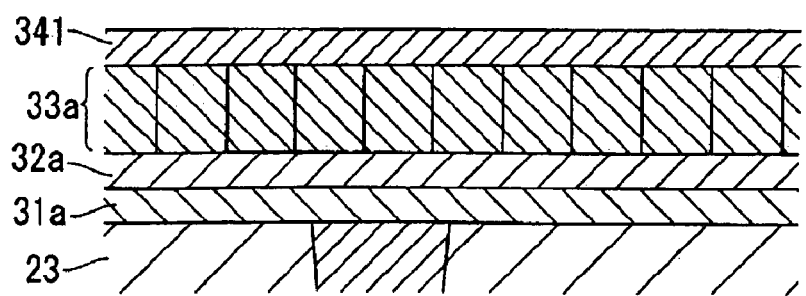

Next, as shown in FIG. 3D, an initial film 341 of the ferroelectric film 34 is formed on the iridium oxide portion 337. More specifically, after forming the iridium oxide portion 337 by thermal oxidation, the base substrate 2 is kept disposed on the suscepter 52 of the MOCVD apparatus 50. Then, source material gas for the ferroelectric film 34 and oxygen gas are supplied through the supply pipes 55 and 56, respectively, in the chamber 51, and the base substrate 2 is heated from its lower surface side by the heater lamps 54 to about 550° C. to 650° C.

In accordance with the present embodiment, as the source material gas, a mixed gas of Pb (DIBM) [Pb $(C_9H_{15}O_2)_2$: lead bis (diisobutyrylmethanate)], Zr (DIBM) [Zr $(C_9H_{15}O_2)_2$: zirconium (diisobutyrylmethanate)], and Ti $(OiPr)_2$ $(DPM)_2$ [Ti $(O-i-C_3H_7)_2$ $(C_{11}H_{19}O_2)_2$: titanium (diisopropoxy) (diisobutyrylmethanate)] is used. As the source material gas, other materials, such as, Pb $(DPM)_2$ [Pb $(C_{11}H_{19}O_2)_2$: lead (dipivaloylmethanate)], Zr $(IBPM)_4$ [Zr $(C_{10}H_{17}O_2)_2$: zirconiumtetrakis (isobutyrylpivaloylmethanate)], and Ti $(OiPr)_2$ $(DPM)_2$ may be used.

Also, the amount of oxygen gas may be set to an amount less than (for example, 0.1 times or greater but 1.0 times or less) the amount necessary for reacting the source material gas. More specifically, by burning carbons, organic compositions of the source material gas, or hydrogen, metal compositions (Pb, Zr and Ti) of the source material gas are separated, and the metal compositions are oxidized and crystallized to become PZT. However, oxygen gas in an amount smaller than the sum of the amount of oxygen gas necessary for burning the organic compositions and the amount of oxygen gas necessary for oxidizing the metal compositions is supplied. Such an amount of oxygen gas can be calculated based on the amount of source material gas supplied.

As a result, the amount of oxygen gas supplied is smaller than the amount of oxygen gas necessary for reacting the source material gas, such that formation of the initial film 341 progresses while depriving oxygen from the iridium oxide portion 337, in other words, while reducing the iridium oxide. As the base substrate 2 is heated at temperatures at which iridium can be crystallized (for example, at 550° C.-650° C.), the reduced iridium re-crystallizes on the iridium film 331. As described above, the iridium oxide layer 334 (see FIG. 3A) is formed in a thickness of 60 nm or less, such that the reduced iridium can succeed the crystal orientation of the iridium film 331 having a (111) crystal orientation, and this crystal orientation can be reflected in the crystal growth direction of the initial film 341. In this manner, the initial film 341 is formed in a (111) crystal orientation; and the iridium oxide portion 337, the reduced and re-crystallized portion of the iridium oxide portion 337, and the iridium film 331 including the portion of the amorphous iridium layer 336 which is re-crystallized on the iridium film 331 form a lower electrode layer 33a.

According to a method in related art, a ferroelectric film is formed on an iridium oxide layer having protrusions (see FIG. 3A), and the protrusions would likely become to be starting points of initial film growth, such that the protrusions would grow larger during the process of forming the ferroelectric film.

However, according to the method of the invention, the iridium oxide layer 334 having the protrusions 335 is once amorphousized by, for example, deoxidization, whereby the top surface of the iridium oxide layer 334 is planarized and its surface layer portion can be uniformly oxidized. As a result, the iridium oxide portion 337 can be formed flat, and a flat initial film 341 can be formed thereon.

Figure 4A:
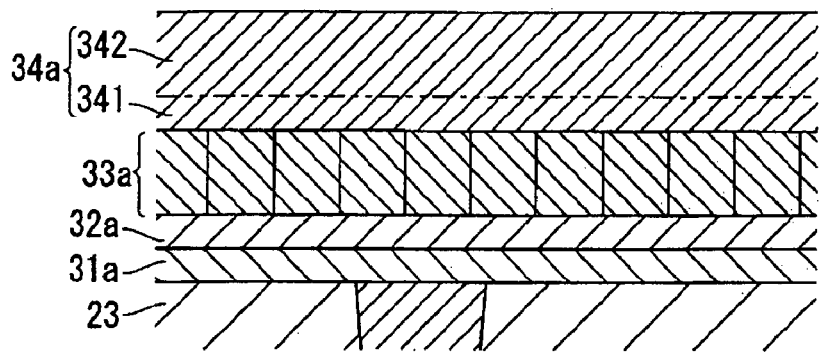
FIGS. 4A-4C are cross-sectional views showing steps of the manufacturing method in accordance with the embodiment of the invention.

Next, as shown in FIG. 4A, a core film 342 is formed on the initial film 341. More specifically, after forming the initial film 341, the base substrate 2 is kept disposed on the suscepter 52 of the MOCVD apparatus 50. Then, material gas for the ferroelectric film 34 and oxygen gas are supplied into the chamber 51 through the supply tubes 55 and 56, respectively, and the base substrate 2 is heated from its lower surface side by the heater lamps 54 at about 450° C.-550° C.

It is noted that the amount of oxygen gas is set to be greater than the amount necessary for reacting the aforementioned source material gas. As the initial film 341 has a (111) crystal orientation as described above, the core film 342 can be formed epitaxial-like thereon, such that the core film 342 can be formed in a (111) crystal orientation. Also, as the oxygen gas is supplied in an amount greater than the amount necessary for reacting the source material gas, the core film 342 can be formed without oxygen deficiencies being generated. Also, by setting the heating temperature lower than the temperature at the time of forming the initial film 341, thermal influence on the transistor 22 (see FIG. 1) can be reduced. In this manner, a ferroelectric film 34a composed of the initial film 341 and the core film 342 is formed.

Figure 4B:
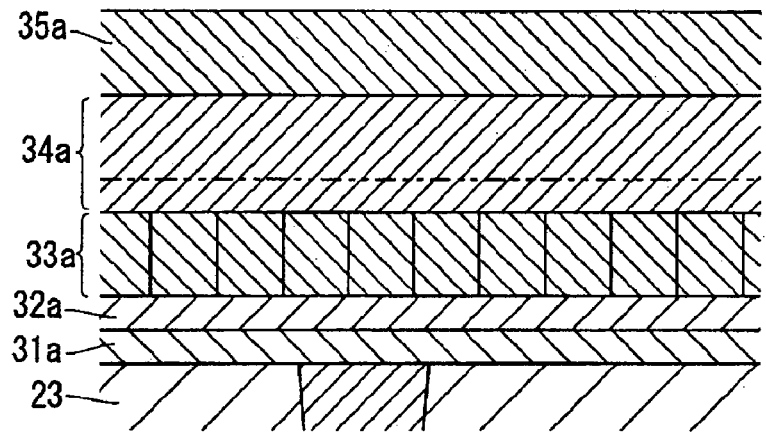

Next, as shown in FIG. 4B, an upper electrode layer 35a comprised of metal materials, such as, Pt, iridium oxide, iridium and the like is formed on the ferroelectric film 34a by, for example, a sputter method or a CVD method.

Figure 4C:
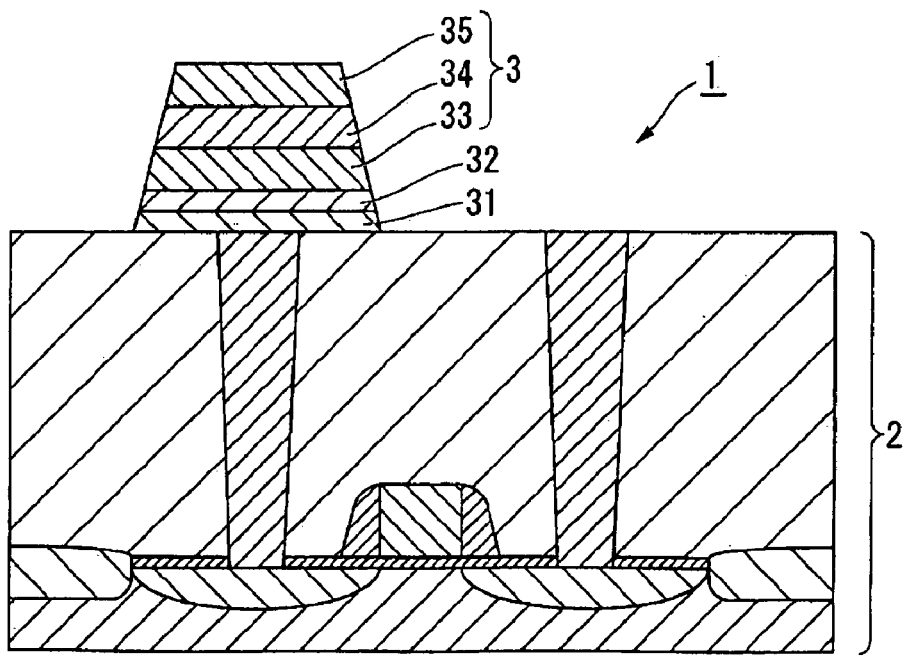

Next, the conductive film 31a, the oxygen barrier film 32a, the lower electrode layer 33a, the ferroelectric film 34a, and the upper electrode layer 35a are patterned by using known resist technique and photolithography technique, thereby forming a ferroelectric capacitor 3. In this manner, the ferroelectric memory 1 shown in FIG. 4C is manufactured.

According to the method of the invention, the initial film 341 having a (111) crystal orientation is formed flat, such that the core film 342 having a (111) crystal orientation can be formed flat thereon. Accordingly, protrusions would not be generated in the ferroelectric film 34a, which can therefore prevent a reduction in the characteristics of the ferroelectric film 34a, which is attributable to non-contribution to polarization inversion of the portions that do not have a desired crystal orientation, such as, protrusions. Therefore, the ferroelectric film 34a can be provided with excellent characteristics, and the ferroelectric capacitor 3 having excellent hysteresis characteristics can be manufactured. Also, because ferroelectric capacitors 3 with excellent hysteresis characteristics are provided, a highly reliable ferroelectric memory 1 with reduced bit failures can be manufactured.

Moreover, in accordance with the present embodiment, the step of changing the iridium oxide layer 334 to the amorphous iridium layer 336, and the step of thermally oxidizing the amorphous iridium layer 336 to form the iridium oxide portion 337 are conducted in the chamber 51 of the MOCVD apparatus 50 in which the ferroelectric film 34a is formed. Accordingly, the efficiency of the process can be improved.

It is noted that, in accordance with the present embodiment, the iridium oxide layer 334 is formed by a thermal oxidation method, but the iridium oxide layer 334 can be formed by a sputter method. Also, the steps of deoxidizing and later thermally oxidizing the iridium oxide layer 334 may be alternately conducted plural times to form the iridium oxide portion 337. As a result, the iridium oxide portion 337 can be more uniformly formed, and the surface roughness caused by the protrusions 335 and the like can be further reduced.

What is claimed is:

1. A method for manufacturing a ferroelectric memory, the method comprising the steps of:
    forming an iridium film above a substrate;
    forming an iridium oxide layer on the iridium film;
    changing the iridium oxide layer to an amorphous iridium layer;
    oxidizing the amorphous iridium layer to form an iridium oxide portion;
    forming a ferroelectric film on the iridium oxide portion by a MOCVD method; and
    forming an electrode on the ferroelectric film.

2. A method for manufacturing a ferroelectric memory according to claim 1, wherein the iridium film has a crystal structure in a (111) crystal orientation.

3. A method for manufacturing a ferroelectric memory according to claim 1, wherein the iridium oxide layer is formed to a thickness between 20 nm and 60 nm.

4. A method for manufacturing a ferroelectric memory according to claim 1, wherein, in the step of changing the iridium oxide layer to an amorphous iridium layer, the iridium oxide layer is changed to an amorphous iridium layer by a thermal treatment.

5. A method for manufacturing a ferroelectric memory according to claim 4, wherein the thermal treatment is conducted in an oxygen-free atmosphere.

6. A method for manufacturing a ferroelectric memory according to claim 1, wherein the step of changing the iridium oxide layer to an amorphous iridium layer and the step of oxidizing the amorphous iridium layer are conducted in a film forming chamber where the ferroelectric film is formed.

7. A method for manufacturing a ferroelectric memory according to claim 1, wherein, after forming the iridium oxide layer, the iridium oxide layer has protrusions on a surface thereof, and after forming the amorphous iridium layer, the amorphous iridium layer has a flat surface.

* * * * *